United States Patent
Tsui et al.

(10) Patent No.: US 8,847,067 B2
(45) Date of Patent: Sep. 30, 2014

(54) DYE SENSITIZED SOLAR CELL

(75) Inventors: Meng-Chin Tsui, New Taipei (TW); Yung-Liang Tung, Hsinchu County (TW); Chuan-Ya Hung, Yunlin County (TW); Sz-Ping Fu, Hsinchu County (TW); Chih-Chou Chang, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 105 days.

(21) Appl. No.: 13/400,526

(22) Filed: Feb. 20, 2012

(65) Prior Publication Data

US 2013/0118582 A1    May 16, 2013

(30) Foreign Application Priority Data

Nov. 15, 2011  (TW) .............................. 100141539 A

(51) Int. Cl.
  *H01L 31/00*   (2006.01)
  *H01G 9/20*    (2006.01)
  *H01L 51/44*   (2006.01)

(52) U.S. Cl.
  CPC ............ *H01G 9/2077* (2013.01); *H01L 51/448* (2013.01); *Y02E 10/542* (2013.01)
  USPC ...................................................... 136/259

(58) Field of Classification Search
  USPC ........................................................ 136/259
  See application file for complete search history.

(56) References Cited

U.S. PATENT DOCUMENTS

| | | | |
|---|---|---|---|
| 5,466,541 A * | 11/1995 | Van Havenbergh et al. .. | 428/690 |
| 6,479,745 B2 | 11/2002 | Yamanaka et al. | |
| 7,375,144 B2 | 5/2008 | Gilmer | |
| 7,594,718 B2 * | 9/2009 | Soutar et al. .................... | 347/95 |
| 7,671,227 B2 | 3/2010 | Dawes et al. | |
| 7,763,669 B2 | 7/2010 | Klare et al. | |
| 2005/0245631 A1* | 11/2005 | Gould et al. .................... | 522/71 |
| 2006/0016473 A1* | 1/2006 | Choi et al. ..................... | 136/263 |
| 2008/0063795 A1 | 3/2008 | Kim et al. | |
| 2009/0242017 A1 | 10/2009 | Yasuda | |
| 2009/0301561 A1 | 12/2009 | Wang et al. | |
| 2010/0200064 A1* | 8/2010 | Hung et al. .................... | 136/259 |
| 2010/0261018 A1* | 10/2010 | Turshani et al. .............. | 428/414 |
| 2011/0023932 A1* | 2/2011 | Fukui et al. .................... | 136/244 |
| 2011/0120546 A1 | 5/2011 | Nesbitt et al. | |

FOREIGN PATENT DOCUMENTS

| | | |
|---|---|---|
| CN | 101465409 | 6/2009 |
| EP | 1548867 A1 | 6/2005 |
| TW | 200911719 | 3/2009 |
| TW | 200924124 | 6/2009 |
| TW | 200943605 | 10/2009 |

OTHER PUBLICATIONS

I. Lee et al., "Reaction Between Oxide Sealant and Liquid Electrolyte in Dye-Sesitized Solar Cells," Solar Energy Materials & Solar Cells, 2010, pp. 1-3, Elsevier B.V., US.

(Continued)

*Primary Examiner* — Eli Mekhlin

(57) ABSTRACT

Disclosed is a dye sensitized solar cell (DSSC) including a substrate having a dye sensitized layer thereon, an opposite substrate having a catalyst layer thereon, a spacer disposed between the substrate and the opposite substrate to define a space, and an electrolyte in the space. The spacer is formed by reacting a photo curable glue including a main oligomer, a photo initiator, a photo curing accelerator agent, a softener, an adhesion enhancer, and a chemical resistance additive.

3 Claims, 3 Drawing Sheets

(56) References Cited

OTHER PUBLICATIONS

R. Sastrawan et al., "New Interdigital Design for Large Area Dye Solar Modules Using a Lead-Free Glass Frit Sealing," Wiley InterScience, Jun. 19, 2006, pp. 697-709, vol. 14, John Wiley & Sons, Ltd., US.

Shuji Noda et al., "Development of Large Size Dye-Sensitized Solar Cell Modules with High Temperature Durability," Synthetic Metals, 2009, pp. 2355-2357, vol. 159, Elsevier B.V., US.

Hiroshi Matsui et al., "Thermal Stability of Dye-Sensitied Solar Cells with Current Collecting Grid," Solar Entry Materials & Solar Cells, 2009, pp. 1110-1115, vol. 93, Elsevier B.V., US.

Deuk Ho Yeon et al., "Zinc Borosilicate Thick Films as a Ag-Protective Layer for Dye-Sensitized Solar Cells," Journal of the Korean Ceramic Society, 2009, pp. 313-316, vol. 46, No. 3, Korea.

Taiwan Patent Office, Office Action, Patent Application Serial No. 100141539, Oct. 24, 2013, Taiwan.

* cited by examiner

US 8,847,067 B2

DYE SENSITIZED SOLAR CELL

CROSS REFERENCE TO RELATED APPLICATIONS

This application claims priority of Taiwan Patent Application No. 100141539, filed on Nov. 15, 2011, the entirety of which is incorporated by reference herein.

BACKGROUND OF THE INVENTION

1. Field of the Invention

The disclosure relates to dye sensitized solar cells, and in particular relates to photo curable glues applied in the dye sensitized solar cells.

2. Description of the Related Art

Dye sensitized solar cells (DSSC) have advantages such as low cost, wide absorption band, and simple processes. Although the DSSC disclosed in *Nature* 353, 737-740 published by Grätzel on 1991, Oct., 24 can be commercialized, many problems therewith still exist. Not only does the dye and electrolyte play an important role for the cell, the sealing glue also plays an important role. For example, commercially sealed cells should pass durability tests, such as high temperature or light exposure tests.

Generally, mainstream sealing materials for the DSSC are the thermoplastic material Surlyn or Bynel, which are usually thermally pressed and paired assembled by heating. The heating mechanism appeals to be simple, however, it has the following disadvantages. (1) The heating temperature is often between 130° C. to 170° C., which may influence the quality of the dye adsorbed on the titanium oxide working electrode. The heating process will cause desorption or deterioration of the dye, thereby reducing the DSSC efficiency. (2) The thermoplastic material is limited by its physical properties such as Tg, and cannot be retained under a high moisture and high temperature environment. In other words, the DSSC utilizing the thermoplastic sealing glue easily decays under a high moisture and high temperature environment, thereby influencing its commercialization. (3) A space between the working electrode and the opposite electrode is not easily controlled by thermally pressing glue. As such, the space should be controlled by the supply, such that process flexibility is reduced.

UV curable sealing glue having advantages such as simple operation, designable material, simple processes, high thermal stability, and high chemical stability, is widely applied in several industries. However, commercially available UV glues have not been developed for DSSC usage. One aspect is that the DSSC industry is new, and it is only now being studied by academic and glue suppliers. Another aspect is that the sealing glue for the DSSC has to be able to withstand corrosion of the electrolyte with high activity, resist sunlight exposure, and sustain vapor pressure from thermal expansion and contraction of the electrolyte having a high boiling point. In short, the frame glue of the DSSC should meet strict requirements.

Accordingly, a specifically designed UV glue composition for a DSSC is called-for.

BRIEF SUMMARY OF THE INVENTION

One embodiment of the disclosure provides a dye sensitized solar cell, comprising: a substrate having a dye sensitized layer thereon; an opposite substrate having a catalyst layer thereon; a spacer disposed between the substrate and the opposite substrate to define a space; and an electrolyte in the space, wherein the spacer is formed by reacting a photo curable glue including a main oligomer, a photo initiator, a photo curing accelerator agent, a softener, an adhesion enhancer, and a chemical resistance additive.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
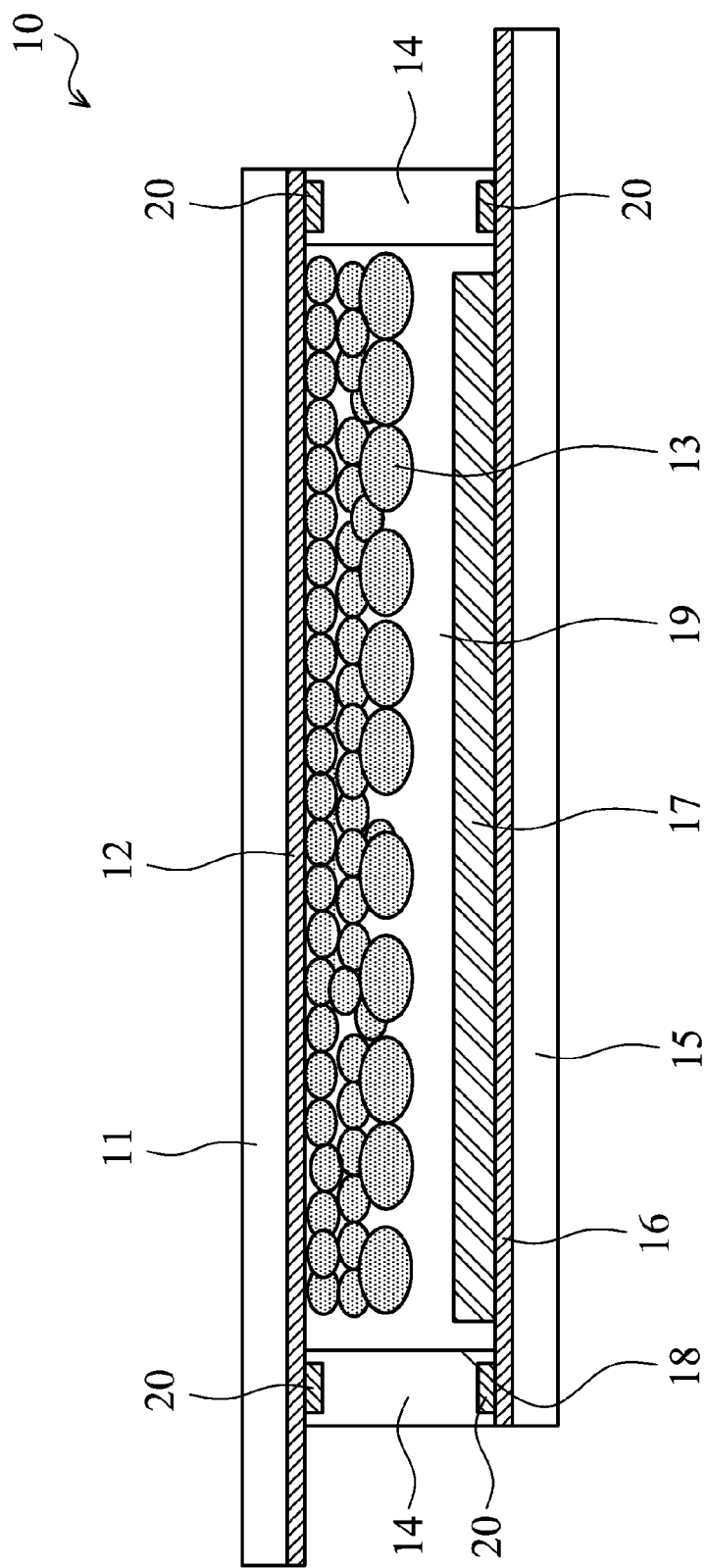
FIGS. 1-2 show dye sensitized solar cells in embodiments of the disclosure.
Figure 2:
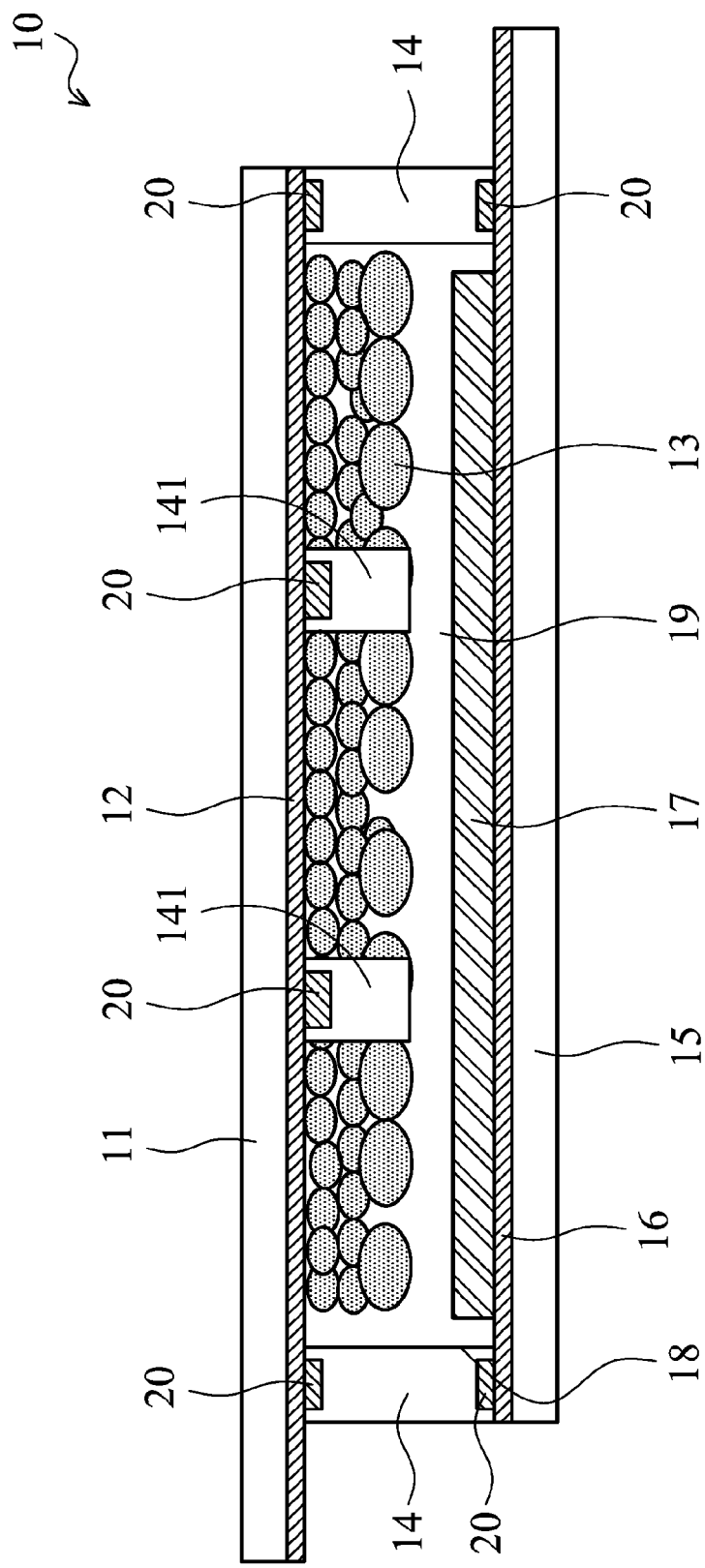

FIG. 1 shows a dye sensitized solar cell (DSSC) 10 in one embodiment of the disclosure. The top substrate 11 is usually glass or a transparent and flexible polymer foil. A transparent conductive oxide 12 such as tin oxide doped with fluorine ($SnO_2$:F, FTO), indium tin oxide (ITO), zinc oxide doped with aluminum (ZnO:Al, AZO), zinc oxide doped with gallium (ZnO:Ga, GZO), or zinc oxide doped with gallium and aluminum (ZnO:Ga, Al, GAZO) is formed on the top substrate 11. A porous material having a thickness of about 10 μm to 30 μm is formed on the transparent conductive oxide 12. In general, the porous material is a nano porous film composed of $TiO_2$ particles having a diameter of about 10 nm to 200 nm. A dye such as ruthenium polypyridyl complex is adsorbed on the nano porous film to form a dye sensitized layer 13 on the transparent conductive oxide 12. The bottom substrate 15 is usually glass or a transparent and flexible polymer foil. A transparent conductive oxide 16 such as FTO is formed on the bottom substrate 15. In addition, platinum can be further plated on the transparent conductive oxide 16 to serve as a platinum catalyst layer 17 for the electrolyte reaction. Spacers 14 are disposed between the top substrate 11 and the bottom substrate 15 to define a compartment 18. In one embodiment, the spacers 14 are formed by reacting a photo curable glue, and the spacers 14 will retain a pore (not shown) for injection of an electrolyte 19 containing iodine into the compartment 18. Thereafter, the pore is sealed by the photo curable glue. In one embodiment, a conductive wire 20 can be formed on the transparent conductive oxide 12 on the top substrate 11 and/or formed on the bottom substrate 15. The conductive wire 20 is used to collect the current produced by the DSSC 10 and then output the current to an external circuit (not shown). The conductive wire 20 should be sealed and protected by the photo curable glue to avoid corrosion of the conductive wire 20 by the electrolyte 19. As the embodiment shown in FIG. 1, the spacers 14 simultaneously serve as the spacers between the top and bottom substrates and the protection glue of the conductive wire 20. In other embodiments, other conductive wires 20 disposed in the compartment 18 are wrapped and sealed by photo curable glue 141.

The photo curable glue includes a main oligomer, a photo initiator, a photo curing accelerator agent, a softener, an adhesion enhancer, and a chemical resistance additive. The main oligomer can be aliphatic polyurethane acrylate oligomer. In one embodiment, the main oligomer occupies 60 wt % to 95 wt % of the photo curable glue. Note that the main oligomer is a pre-polymerized oligomer rather than an organic monomer, and the oligomer usually has a high viscosity. An overly high amount of the main oligomer will increase the viscosity of the photo curable glue and complicate the processes. An overly low amount of the main oligomer causes the main oligomer to lose its effect. Because the solidified photo curable glue properties depend on the main oligomer properties, the glue with the overly low amount of the main oligomer cannot have predetermined properties.

The photo initiator will form radicals after being exposed, for example, an UV exposure, thereby crosslinking and curing the main oligomer with other additives. The photo initiator can be 2-isopropyl-9H-thioxanthen-9-one, 2-hydroxy-2-methylpropiophenone, 2,4,6-trimethylbenzophenone, 4-methylbenzophenone[2-hydroxy-2-methyl-1-[4-(1-methylvinyl)phenyl]propanone], 2-Methyl-4'-(methylthio)-2-morpholinopropiophenone, or combinations thereof. In one embodiment, the photo initiator occupies 0.5 wt % to 10 wt % of the photo curable glue. An overly high amount of the photo initiator will leave too much of the unreacted photo initiator, which cannot contribute to the crosslinking. In addition, the unreacted photo initiator will remain on a surface or in the body of the solidified photo curable glue to degrade its adhesion or mechanical properties, or even permeate to the electrolyte, therefore reducing DSSC efficiency. An overly low amount of the photo initiator will not allow solidification to be completed, such that the glue cannot be molded to have the predetermined properties.

The photo curing accelerator agent may accelerate photo curing and reduce the molding period of the photo curable glue. The photo curing accelerator agent can be trimethylolpropane triacrylate, ethoxylated trimethylolpropane triacrylate, or combinations thereof. In one embodiment, the photo curing accelerator occupies 1 wt % to 8 wt % of the photo curable glue. An overly high amount of the photo curing accelerator agent will make the photo curable glue to be overly fast crosslinked, such that the glue will be largely shrunk during curing and cannot be stably adhered onto the substrate. An overly low amount of the photo curing accelerator agent will slow the curing process, thus requiring a longer exposure period. Therefore, the dye sensitized layer will be exposed to a UV of high energy for a longer period, such that the dye will be degraded and the DSSC efficiency will be reduced.

The softener may enhance the stress of the photo curable glue, such that the photo curable glue will not easily be disrupted. The softener can be 1,6-hexanediol diacrylate, neopentyl glycol diacrylate, tripropylene glycol diacrylate, or combinations thereof. In one embodiment, the softener occupies 1 wt % to 8 wt % of the photo curable glue. An overly high amount of the softener will make the solidified glue be loose, such that the DSSC efficiency cannot be sustained for a long period due to the air easily from the environment permeating into the electrolyte, or the electrolyte easily permeating out through the glue. An overly low amount of the softener will make the solidified glue be harder. Because the hard glue cannot sustain thermal expansion and contraction of the electrolyte, the sealing will not work during temperature changes of the DSSC.

The adhesion enhancer has hydroxyl group, siloxy group, or fluorine, such that covalent bondings can be formed between the photo curable glue and the substrate surface. The adhesive enhancer can be acrylic acid, 3-(trimethoxysilyl)propyl methacrylate, tetrahydrofurfuryl acrylate, or combinations thereof. In one embodiment, the adhesion enhancer occupies 2 wt % to 8 wt % of the photo curable glue. An overly high amount of the adhesion enhancer will not further help the adhesion force, and reduce other functions such as chemical resistance, reaction rate, and/or crosslinking degree come from other additives. An overly low amount of the adhesion enhancer will lower the adhesion between the glue and the substrate, and the solidified glue peel (or the sealing will not work) during a high temperature test.

The chemical resistance agent has a high sterically-hindered group to block ions of the electrolyte penetrating the photo curable glue. The chemical resistance agent can be acrylic acid isobornyl ester, 2-phenoxyethyl acrylate, 2-(2-ethoxyethoxy)ethyl acrylate, or combinations thereof. In one embodiment, the chemical resistance agent occupies 1 wt % to 8 wt % of the photo curable glue. An overly high amount of the chemical resistance agent will not further help the chemical resistance of the photo curable agent, and reduce other functions such as adhesion, reaction rate, and/or mechanical strength come from other additives. An overly low amount of the chemical resistance agent will lower the chemical resistance of the photo curable glue in the electrolyte, such that the glue will have a higher weight change ratio during a chemical resistance test of the electrolyte. In practice, the sealing easily will not work due to an insufficient amount of the chemical resistance agent.

EXAMPLES

Example 1

Different weight ratios of aliphatic polyurethane acrylate oligomer (CN9014 commercially available from Sartomer) served as a main oligomer, 2-isopropyl-9H-thioxanthen-9-one (ITX) and 2-methyl-4'-(methylthio)-2-morpholinopropiophenone served as photo initiators, trimethylolpropane triacrylate (TMPTA) and ethoxylated trimethylolpropane triacrylate ($EO_3$TMPTA) served as photo curing accelerator agents, 1,6-hexanediol diacrylate (HDODA), neopentyl glycol diacrylate (NPGPODA), and tripropylene glycol diacrylate (TPGPODA) served as softeners, acrylic acid (AA), 3-(trimethoxysilyl)propyl methacrylate, and tetrahydrofurfuryl acrylate (THFA) served as adhesion enhancers, and acrylic acid isobornyl ester (IBOA), 2-phenoxyethyl acrylate (2-PEA), and 2-(2-ethoxyethoxy)ethyl acrylate (EOEOEA) served as chemical resistance agents, and they were all mixed to formulate photo curable glues. The composition ratios of the photo curable glues were tabulated as shown in Table 1.

TABLE 1

| | Main oligomer | Photo initiator | | photo curing accelerator agent Composition | | Softener | | |
|---|---|---|---|---|---|---|---|---|
| Serial No. | Aliphatic Urethane Acrylate | ITX | 2-Methyl-(methylthio)-2-morpholinopropiophenone | TMPTA | $EO_3$TMPTA | HDODA | NPGPODA | TPGDA |
| ITRI-M90 | 63.30% | 1.33% | 6.67% | 6.67% | 0.00% | 1.60% | 0.00% | 0.00% |
| ITRI-MAA | 64.39% | 2.10% | 6.99% | 6.99% | 0.00% | 0.00% | 6.54% | 0.00% |
| ITRI-MAS | 58.23% | 2.06% | 6.87% | 6.87% | 0.00% | 3.02% | 0.00% | 3.02% |

TABLE 1-continued

| Serial No. | | | | | | | | |
|---|---|---|---|---|---|---|---|---|
| ITRI-MFA | 58.59% | 0.64% | 5.10% | 6.37% | 0.00% | 2.99% | 0.00% | 2.99% |
| ITRI-MNA | 67.99% | 3.55% | 5.67% | 3.42% | 3.42% | 0.00% | 7.09% | 0.00% |
| ITRI-MDA | 55.05% | 3.37% | 4.04% | 5.76% | 0.00% | 6.73% | 5.05% | 0.00% |
| ITRI-M2A | 58.59% | 0.64% | 6.37% | 0.00% | 5.99% | 0.00% | 6.37% | 6.37% |
| ITRI-MEA | 63.17% | 3.51% | 8.77% | 0.00% | 7.02% | 6.45% | 0.00% | 0.00% |
| ITRI-MES | 65.96% | 3.91% | 3.91% | 0.00% | 2.34% | 10.13% | 0.00% | 0.00% |
| ITRI-MEO | 69.76% | 0.73% | 5.84% | 7.30% | 0.00% | 0.00% | 7.30% | 0.00% |
| ITRI-ME2 | 60.80% | 2.21% | 7.35% | 7.35% | 0.00% | 0.00% | 3.68% | 0.00% |
| (1)Comparison-1 | 65.84% | 0.66% | 3.87% | 0.00% | 0.00% | 9.88% | 3.29% | 0.00% |
| Comparison-2 | 66.16% | 0.66% | 3.40% | 3.31% | 6.62% | 0.00% | 0.00% | 0.00% |
| Comparison-3 | 63.24% | 0.63% | 2.93% | 7.90% | 6.32% | 9.49% | 0.00% | 0.00% |
| Comparison-4 | 64.28% | 0.64% | 2.93% | 9.64% | 0.00% | 9.64% | 0.00% | 0.00% |

| | adhesion enhancer | | | Chemical resistance agent | | |
|---|---|---|---|---|---|---|
| | Composition | | | | | |
| Serial No. | AA | THFA | 3-(Trimethoxysilyl)propyl methacrylate | IBOA | 2-PEA | EOEOEA |
| ITRI-M90 | 3.19% | 3.19% | 3.19% | 8.00% | 1.60% | 1.60% |
| ITRI-MAA | 6.99% | 0.00% | 0.00% | 6.54% | 0.00% | 0.00% |
| ITRI-MAS | 6.87% | 0.00% | 3.44% | 5.15% | 6.04% | 0.00% |
| ITRI-MFA | 6.37% | 6.37% | 0.00% | 6.37% | 0.00% | 5.10% |
| ITRI-MNA | 5.67% | 0.00% | 0.00% | 1.71% | 1.71% | 0.00% |
| ITRI-MDA | 6.73% | 0.00% | 0.00% | 6.73% | 2.88% | 5.76% |
| ITRI-M2A | 5.10% | 0.00% | 0.00% | 6.37% | 5.10% | 0.00% |
| ITRI-MEA | 7.02% | 0.00% | 0.00% | 1.61% | 0.00% | 3.23% |
| ITRI-MES | 3.91% | 0.00% | 3.91% | 6.76% | 0.00% | 0.00% |
| ITRI-MEO | 3.52% | 0.00% | 0.00% | 0.00% | 0.00% | 5.84% |
| ITRI-ME2 | 6.31% | 0.00% | 6.31% | 3.68% | 2.21% | 1.58% |
| (1)Comparison-1 | 6.58% | 3.29% | 0.00% | 6.58% | 0.00% | 0.00% |
| Comparison-2 | 6.62% | 3.31% | 0.00% | 6.62% | 3.31% | 0.00% |
| Comparison-3 | 0.00% | 0.00% | 0.00% | 6.32% | 3.16% | 0.00% |
| Comparison-4 | 6.43% | 6.43% | 0.00% | 0.00% | 0.00% | 0.00% |

Note
(1)the glue is not completely solidified.

A glass substrate coated with a silver conductive wire thereon was wrapped by the described photo curable glue. The photo curable glue on the glass substrates was cured by exposure to a UV light of 150 mW/cm$^2$ for 20 seconds. The sample was immersed into a long-lifetime iodine-containing electrolyte (mixture of $I_2$, PMII (1-Propyl-3-Methylimidazolium), NMBI (N-methylbenzimidazole), and MPN (3-Methoxypropionitrile)) of 60° C. for 72 hours. Thereafter, the weight change ratio of the sample was tabulated as shown in Table 2. As shown at appearance, the photo curable glues ITRI-M90, IRTI-MAA, ITRI-MAS, ITRI-MFA, ITRI-MNA, ITRI-MDA, ITRI-M2A, ITRI-MEA, ITRI-MES, ITRI-MEO, and ITRI-ME2 didn't appear to show the degradation phenomenon such as decomposition or peeling. Even if the photo curable glues ITRI-M90, IRTI-MAA, ITRI-MAS, ITRI-MFA, ITRI-MNA, ITRI-MDA, ITRI-M2A, ITRI-MEA, ITRI-MES, ITRI-MEO, and ITRI-ME2 were further immersed in the iodine-containing electrolyte of 85° C. for 100 hours (totally 60° C. for 72 hours and 85° C. for 100 hours), the silver conductive wires still remained as originally, free of corrosion. On the other hand, Comparison 1 without the photo curing enhancer did not completely solidify, and degraded after being immersed into the iodine-containing electrolyte. Comparison 3 without the adhesion enhancer peeled after being immersed into the iodine-containing electrolyte. Comparison 4 without the chemical resistance agent peeled after being immersed into the iodine-containing electrolyte. Accordingly, the photo curable glue of the disclosure may efficiently protect the silver conductive wires from electrolyte corrosion.

Figure 3:
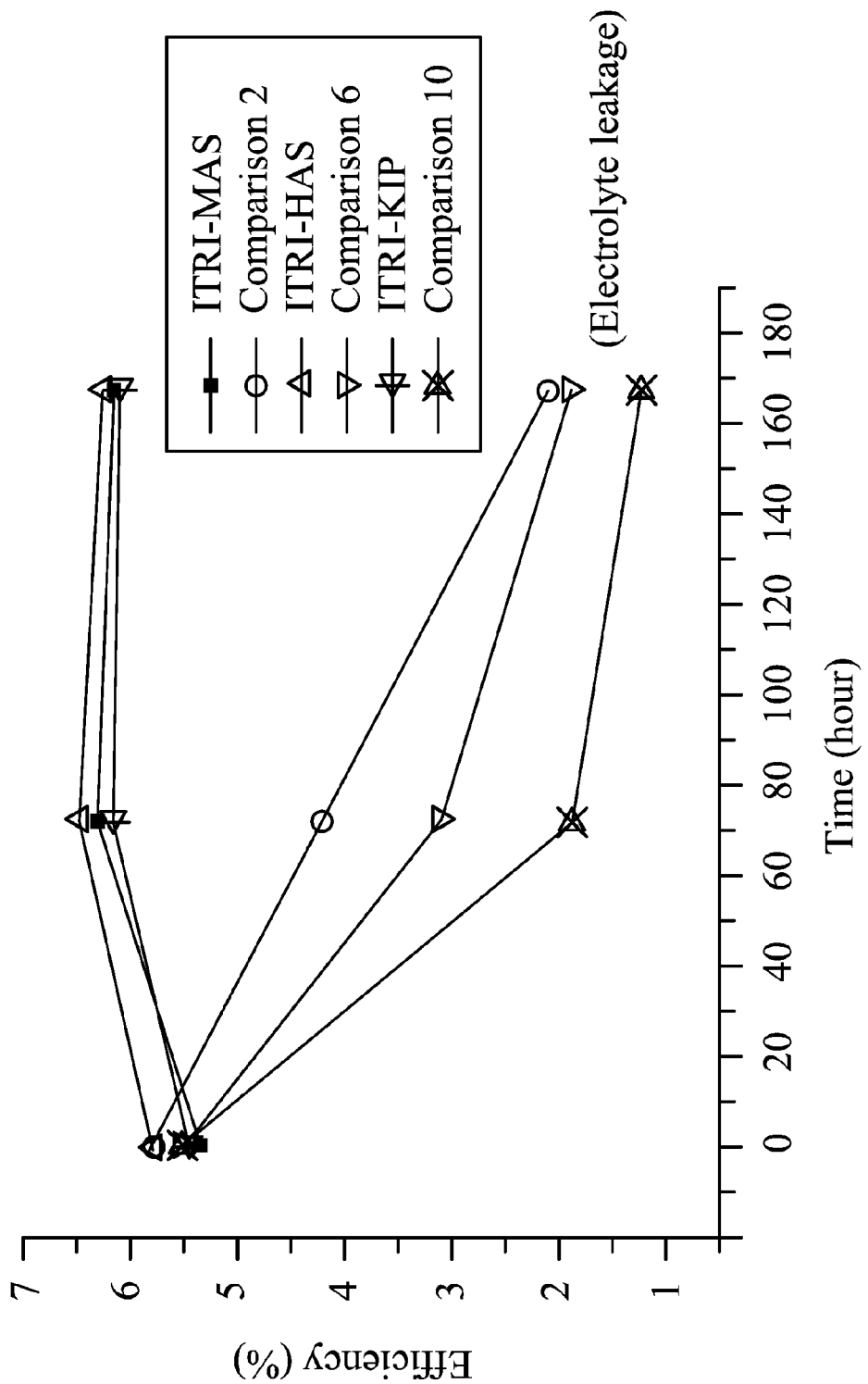
FIG. 3 shows sealing tests of UV glues at 60° C. for a long period in Examples and Comparative Examples of the disclosure.

The photo curable glues ITRI-MAS and Comparison 2 were further utilized in sealing DSSCs, respectively. The sealed DSSCs were put into an oven of 60° C. to check their sealing effect for a long period, as shown in FIG. 3. In practice, Comparison 2 without the softener would largely shrink and poorly adhere to the substrate when being sealed. The sealing of Comparison 2 peeled at a high temperature during a long period test, such that the efficiency of the DSSC leaking the electrolyte would be reduced. The Comparison 2 without the softener would lose its adhesion due to thermal expansion and contraction, such that sealing did not work to reduce the DSSC efficiency.

TABLE 2

| Serial No. | Degradation or not | Weight change ratio |
|---|---|---|
| ITRI-M90 | No degradation | +1.74 wt % |
| ITRI-MAA | No degradation | +5.71 wt % |
| ITRI-MAS | No degradation | +0.73 wt % |
| ITRI-MFA | No degradation | +5.94 wt % |
| ITRI-MNA | No degradation | +4.35 wt % |
| ITRI-MDA | No degradation | +2.34 wt % |
| ITRI-M2A | No degradation | +5.47 wt % |
| ITRI-MEA | No degradation | +5.44 wt % |
| ITRI-MES | No degradation | +6.22 wt % |
| ITRI-MEO | No degradation | +6.52 wt % |
| ITRI-ME2 | No degradation | +4.65 wt % |
| Comparison-1 | Degradation | −8.99 wt % |
| Comparison-2 | No degradation | +3.48 wt % |
| Comparison-3 | Peeling | Not available |
| Comparison-4 | Peeling | Not available |

Example 2

Different weight ratios of aliphatic polyurethane acrylate oligomer (CN9014 commercially available from Sartomer) served as a main oligomer, 2-hydroxy-2-methylpropiophenone served as photo initiator, trimethylolpropane triacrylate (TMPTA) and ethoxylated trimethylolpropane triacrylate (EO₃TMPTA) served as photo curing accelerator agents, 1,6-hexanediol diacrylate (HDODA), neopentyl glycol diacrylate (NPGPODA), and tripropylene glycol diacrylate (TPGPODA) served as softeners, acrylic acid (AA), 3-(trimethoxysilyl)propyl methacrylate, and tetrahydrofurfuryl acrylate (THFA) served as adhesion enhancer, and acrylic acid isobornyl ester (IBOA), 2-phenoxyethyl acrylate (2-PEA), and 2-(2-ethoxyethoxy)ethyl acrylate (EOEOEA) served as chemical resistance agents, and they were all mixed to formulate photo curable glues. The composition ratios of the photo curable glues were tabulated as shown in Table 3.

nomenon such as decomposition or peeling. Even if the photo curable glues ITRI-H90, IRTI-HAA, ITRI-HAS, ITRI-HFA, ITRI-HNA, ITRI-HAD, ITRI-H2A, ITRI-HEA, ITRI-HES, ITRI-HEO, and ITRI-HE2 were further immersed in the iodine-containing electrolyte of 85° C. for 100 hours (totally 60° C. for 72 hours and 85° C. for 100 hours), the silver conductive wires still remained as originally, free of corrosion. On the other hand, Comparison 5 without the photo curing enhancer did not completely solidify, and degraded after being immersed into the iodine-containing electrolyte. Comparison 7 without the adhesion enhancer peeled after being immersed into the iodine-containing electrolyte. Com-

TABLE 3

| Serial No. | Main oligomer | Photo initiator | photo curing accelerator agent Composition | | Softener | | |
|---|---|---|---|---|---|---|---|
| | Aliphatic Urethane Acrylate | 2-hydroxy-2-methylpropiophenone | TMPTA | EO₃TMPTA | HDODA | NPGPODA | TPGDA |
| ITRI-H90 | 83.33% | 2.50% | 1.67% | 0.00% | 0.00% | 0.00% | 83.33% |
| ITRI-HAA | 72.46% | 2.17% | 3.63% | 0.00% | 7.25% | 0.00% | 72.46% |
| ITRI-HAS | 64.52% | 3.23% | 6.45% | 0.00% | 6.45% | 0.00% | 64.52% |
| ITRI-HFA | 70.91% | 2.13% | 3.55% | 0.00% | 7.09% | 0.00% | 70.91% |
| ITRI-HNA | 73.53% | 2.21% | 3.68% | 3.68% | 0.00% | 7.35% | 73.53% |
| ITRI-HDA | 68.96% | 1.38% | 6.90% | 0.00% | 6.89% | 5.51% | 68.96% |
| ITRI-H2A | 71.44% | 3.57% | 3.57% | 0.00% | 0.00% | 7.14% | 71.44% |
| ITRI-HEA | 69.93% | 1.40% | 0.00% | 5.59% | 0.00% | 6.99% | 69.93% |
| ITRI-HES | 69.93% | 3.50% | 0.00% | 6.99% | 6.99% | 0.00% | 69.93% |
| ITRI-HEO | 75.76% | 3.03% | 7.57% | 0.00% | 0.00% | 3.79% | 75.76% |
| ITRI-HE2 | 86.20% | 2.59% | 1.72% | 0.00% | 0.00% | 2.59% | 86.20% |
| (2)Comparison-5 | 68.49% | 4.11% | 0.00% | 0.00% | 6.85% | 0.00% | 0.00% |
| Comparison-6 | 68.97% | 3.45% | 6.90% | 0.00% | 0.00% | 0.00% | 0.00% |
| Comparison-7 | 68.97% | 3.45% | 6.90% | 0.00% | 10.34% | 0.00% | 0.00% |
| Comparison-8 | 70.18% | 3.51% | 7.02% | 0.00% | 7.02% | 0.00% | 0.00% |

| Serial No. | adhesion enhancer Composition | | | Chemical resistance agent | | |
|---|---|---|---|---|---|---|
| | AA | 3-(Trimethoxysilyl)propyl methacrylate | THFA | IBOA | 2-PEA | EOEOEA |
| ITRI-H90 | 4.17% | 0.00% | 4.17% | 0.00% | 0.00% | 0.00% |
| ITRI-HAA | 0.00% | 3.63% | 3.63% | 0.00% | 7.25% | 0.00% |
| ITRI-HAS | 6.45% | 0.00% | 3.23% | 0.00% | 0.00% | 9.68% |
| ITRI-HFA | 0.00% | 5.68% | 3.55% | 0.00% | 0.00% | 3.55% |
| ITRI-HNA | 0.00% | 5.88% | 0.00% | 0.00% | 0.00% | 0.00% |
| ITRI-HDA | 0.00% | 3.45% | 3.45% | 0.00% | 3.45% | 0.00% |
| ITRI-H2A | 3.57% | 3.57% | 3.57% | 0.00% | 3.57% | 0.00% |
| ITRI-HEA | 0.00% | 6.99% | 5.59% | 0.00% | 0.00% | 3.50% |
| ITRI-HES | 0.00% | 3.50% | 0.00% | 5.60% | 3.50% | 0.00% |
| ITRI-HEO | 0.00% | 2.27% | 1.52% | 0.00% | 0.00% | 6.06% |
| ITRI-HE2 | 0.00% | 0.00% | 4.31% | 0.00% | 2.59% | 0.00% |
| (2)Comparison-5 | 6.85% | 0.00% | 3.42% | 0.00% | 0.00% | 10.27% |
| Comparison-6 | 6.90% | 0.00% | 3.45% | 0.00% | 0.00% | 10.34% |
| Comparison-7 | 0.00% | 0.00% | 0.00% | 0.00% | 0.00% | 10.34% |
| Comparison-8 | 7.02% | 0.00% | 5.26% | 0.00% | 0.00% | 0.00% |

Note
(2)the glue is not completely solidified.

A glass substrate coated with a silver conductive wire thereon was wrapped by the described photo curable glue. The photo curable glue on the glass substrates was cured by exposure to a UV light of 150 mW/cm² for 20 seconds. The sample was immersed into a long-lifetime iodine-containing electrolyte (mixture of I₂, PMII (1-Propyl-3-Methylimidazolium), NMBI (N-methylbenzimidazole), and MPN (3-Methoxypropionitrile)) of 60° C. for 72 hours. Thereafter, the weight change ratio of the sample was tabulated as shown in Table 4. As shown at appearance, the photo curable glues ITRI-H90, IRTI-HAA, ITRI-HAS, ITRI-HFA, ITRI-HNA, ITRI-HAD, ITRI-H2A, ITRI-HEA, ITRI-HES, ITRI-HEO, and ITRI-HE2 didn't appear to show the degradation pheparison 8 without the chemical resistance agent peeled after being immersed into the iodine-containing electrolyte. Accordingly, the photo curable glue of the disclosure may efficiently protect the silver conductive wires from electrolyte corrosion.

The photo curable glues ITRI-HAS and Comparison 6 were further utilized in sealing DSSCs, respectively. The sealed DSSCs were put into an oven of 60° C. to check their sealing effect for a long period, as shown in FIG. 3. In practice, Comparison 6 without the softener would largely shrink and poorly adhere to the substrate when being sealed. The sealing of Comparison 6 would peel at a high temperature during a long period test, such that the efficiency of the DSSC leaking the electrolyte would be reduced. The Comparison 6 without the softener would lose its adhesion due to thermal expansion and contraction, such that sealing would not work to reduce the DSSC efficiency.

TABLE 4

| Serial No. | Degradation or not | Weight change ratio |
|---|---|---|
| ITRI-H90 | No degradation | +4.78 wt % |
| ITRI-HAA | No degradation | +1.28 wt % |
| ITRI-HAS | No degradation | +0.97 wt % |
| ITRI-HFA | No degradation | +6.47 wt % |
| ITRI-HNA | No degradation | +3.40 wt % |
| ITRI-HDA | No degradation | +3.15 wt % |
| ITRI-H2A | No degradation | −2.14 wt % |
| ITRI-HEA | No degradation | +3.21 wt % |
| ITRI-HES | No degradation | +4.31 wt % |
| ITRI-HEO | No degradation | +4.67 wt % |
| ITRI-HE2 | No degradation | +3.72 wt % |
| Comparison-5 | Degradation and Peeling | Not available |
| Comparison-6 | No degradation | +3.48 wt % |
| Comparison-7 | Peeling | Not available |
| Comparison-8 | Peeling | Not available |

Example 3

Different weight ratios of aliphatic polyurethane acrylate oligomer (CN9014 commercially available from Sartomer) served as a main oligomer, mixture of 2,4,6-trimethylbenzophenone, 4-methylbenzophenone, and 2-hydroxy-2-methyl-1-[4-(1-methylvinyl)phenyl]propanone (KT55 commercially available from Esacure) served as photo initiators, trimethylolpropane triacrylate (TMPTA) and ethoxylated trimethylolpropane triacrylate (EO$_3$TMPTA) served as photo curing accelerator agents, 1,6-hexanediol diacrylate (HDODA), neopentyl glycol diacrylate (NPGPODA), and tripropylene glycol diacrylate (TPGPODA) served as softeners, acrylic acid (AA), 3-(trimethoxysilyl)propyl methacrylate, and tetrahydrofurfuryl acrylate (THFA) served as adhesion enhancers, and acrylic acid isobornyl ester (IBOA), 2-phenoxyethyl acrylate (2-PEA), and 2-(2-ethoxyethoxy) ethyl acrylate (EOEOEA) served as chemical resistance agents, and they were all mixed to formulate photo curable glues. The composition ratios of the photo curable glues were tabulated as shown in Table 5.

TABLE 5

| Serial No. | Main oligomer | Photo initiator | Photo accelerator | | Softener | | |
|---|---|---|---|---|---|---|---|
| | Aliphatic Urethane Acrylate | KT55 | TMPTA | EO$_3$TMPTA | HDODA | NPGPODA | TPGDA |
| ITRI-K90 | 74.07% | 2.22% | 1.48% | 0.00% | 7.41% | 0.00% | 0.00% |
| ITRI-KAA | 78.12% | 2.34% | 3.91% | 0.00% | 3.91% | 0.00% | 3.91% |
| ITRI-KAS | 73.53% | 1.47% | 3.68% | 0.00% | 0.00% | 3.68% | 3.68% |
| ITRI-KFA | 76.32% | 2.29% | 3.82% | 0.00% | 0.00% | 0.00% | 0.00% |
| ITRI-KNA | 77.52% | 2.33% | 0.00% | 0.00% | 0.00% | 7.75% | 0.00% |
| ITRI-KDA | 71.43% | 1.43% | 7.14% | 0.00% | 7.14% | 5.71% | 0.00% |
| ITRI-K2A | 71.44% | 3.57% | 3.57% | 0.00% | 0.00% | 7.14% | 3.57% |
| ITRI-KEA | 72.47% | 1.45% | 0.00% | 5.80% | 7.25% | 0.00% | 0.00% |
| ITRI-KES | 69.93% | 3.50% | 0.00% | 6.99% | 0.00% | 1.40% | 5.59% |
| ITRI-KEO | 70.42% | 2.82% | 7.04% | 0.00% | 0.00% | 3.52% | 0.00% |
| ITRI-KE2 | 86.20% | 2.59% | 1.72% | 0.00% | 0.00% | 2.59% | 0.00% |
| ITRI-KIP | 61.58% | 1.48% | 6.16% | 0.00% | 6.16% | 4.62% | 0.00% |
| (3)Comparison-9 | 64.29% | 1.96% | 0.00% | 0.00% | 6.43% | 4.82% | 0.00% |
| Comparison-10 | 67.95% | 1.48% | 6.79% | 0.00% | 0.00% | 0.00% | 0.00% |
| Comparison-11 | 66.79% | 1.48% | 6.68% | 3.34% | 6.68% | 5.01% | 0.00% |
| Comparison-12 | 66.79% | 1.48% | 6.68% | 0.00% | 6.68% | 5.01% | 0.00% |

| Serial No | adhesion enhancer | | | Chemical resistance agent | | |
|---|---|---|---|---|---|---|
| | AA | THFA | 3-(Trimethoxysilyl)propyl methacrylate | 2-PEA | EOEOEA | IBOA |
| ITRI-K90 | 7.41% | 0.00% | 3.70% | 0.00% | 0.00% | 3.71% |
| ITRI-KAA | 3.91% | 0.00% | 0.00% | 0.00% | 0.00% | 3.91% |
| ITRI-KAS | 5.88% | 0.00% | 3.68% | 0.00% | 0.00% | 4.41% |
| ITRI-KFA | 6.11% | 3.82% | 0.00% | 0.00% | 3.82% | 3.82% |
| ITRI-KNA | 6.20% | 0.00% | 0.00% | 0.00% | 0.00% | 6.20% |
| ITRI-KDA | 3.58% | 0.00% | 0.00% | 0.00% | 0.00% | 3.58% |
| ITRI-K2A | 3.57% | 0.00% | 0.00% | 3.57% | 0.00% | 3.57% |
| ITRI-KEA | 7.24% | 0.00% | 0.00% | 0.00% | 0.00% | 5.80% |
| ITRI-KES | 3.50% | 0.00% | 5.60% | 0.00% | 0.00% | 3.50% |
| ITRI-KEO | 7.04% | 0.00% | 3.52% | 0.00% | 5.63% | 0.00% |
| ITRI-KE2 | 0.00% | 0.00% | 0.00% | 2.59% | 0.00% | 4.31% |
| ITRI-KIP | 6.16% | 1.54% | 3.08% | 3.08% | 0.00% | 6.16% |
| (3)Comparison-9 | 6.43% | 3.21% | 3.21% | 3.21% | 0.00% | 6.43% |
| Comparison-10 | 6.79% | 3.40% | 3.40% | 3.40% | 0.00% | 6.79% |
| Comparison-11 | 0.00% | 0.00% | 0.00% | 3.34% | 0.00% | 6.68% |
| Comparison-12 | 6.68% | 3.34% | 3.34% | 0.00% | 0.00% | 0.00% |

Note
(3)the glue is not completely solidified.

A glass substrate coated with a silver conductive wire thereon was wrapped by the described photo curable glue. The photo curable glue on the glass substrates was cured by exposure to a UV light of 150 mW/cm² for 20 seconds. The sample was immersed into a long-lifetime iodine-containing electrolyte (mixture of I₂, PMII (1-Propyl-3-Methylimidazolium), NMBI (N-methylbenzimidazole), and MPN (3-Methoxypropionitrile)) of 60° C. for 72 hours. Thereafter, the weight change ratio of the sample was tabulated as shown in Table 6. As shown at appearance, the photo curable glues ITRI-K90, IRTI-KAA, ITRI-KAS, ITRI-KFA, ITRI-KNA, ITRI-KDA, ITRI-K2A, ITRI-KEA, ITRI-KES, ITRI-KEO, ITRI-KE2, and ITRI-KIP didn't appear to show the degradation phenomenon such as decomposition or peeling. Even if the photo curable glues ITRI-K90, IRTI-KAA, ITRI-KAS, ITRI-KFA, ITRI-KNA, ITRI-KDA, ITRI-K2A, ITRI-KEA, ITRI-KES, ITRI-KEO, ITRI-KE2, and ITRI-KIP were further immersed in the iodine-containing electrolyte of 85° C. for 100 hours (totally 60° C. for 72 hours and 85° C. for 100 hours), the silver conductive wires still remained as originally, free of corrosion. On the other hand, Comparison 9 without the photo curing enhancer did not completely solidify, and degraded after being immersed into the iodine-containing electrolyte. Comparison 11 without the adhesion enhancer peeled after being immersed into the iodine-containing electrolyte. Comparison 12 without the chemical resistance agent peeled after being immersed into the iodine-containing electrolyte. Accordingly, the photo curable glue of the disclosure may efficiently protect the silver conductive wires from electrolyte corrosion.

The photo curable glues ITRI-KIP and Comparison 10 were further utilized in sealing DSSCs, respectively. The sealed DSSCs were put into an oven of 60° C. to check their sealing effect for a long period, as shown in FIG. 3. In practice, Comparison 10 without the softener would largely shrink and poorly adhere to the substrate when being sealed. The sealing of Comparison 10 would peel at a high temperature during a long period test, such that the efficiency of the DSSC leaking the electrolyte would be reduced. The Comparison 10 without the softener would lose its adhesion due to thermal expansion and contraction, such that sealing would not work to reduce the DSSC efficiency.

TABLE 6

| Serial No. | Degradation or not | Weight change ratio |
|---|---|---|
| ITRI-K90 | No degradation | +3.48 wt % |
| ITRI-KAA | No degradation | +3.21 wt % |
| ITRI-KAS | No degradation | +1.04 wt % |
| ITRI-KFA | No degradation | +5.65 wt % |
| ITRI-KNA | No degradation | +4.47 wt % |
| ITRI-KDA | No degradation | +2.34 wt % |
| ITRI-K2A | No degradation | +5.66 wt % |
| ITRI-KEA | No degradation | +5.49 wt % |
| ITRI-KES | No degradation | +5.12 wt % |
| ITRI-KEO | No degradation | +3.28 wt % |
| ITRI-KE2 | No degradation | +5.18 wt % |
| ITRI-KIP | No degradation | +1.32 wt % |
| Comparison-9 | No degradation | −7.64 wt % |
| Comparison-10 | No degradation | +3.48 wt % |
| Comparison-11 | Peeling | Not available |
| Comparison-12 | Peeling | Not available |

Example 4

The photo curable glue ITRI-MAS was coated on a top substrate and on silver conductive wires onto a bottom substrate by screen printing. The top substrate and the bottom substrate were paired assembled and exposed under a UV light to cure the photo curable glue ITRI-MAS, thereby forming spacers. The spacer was then mechanically drilled to form an injection hole. An iodine-containing electrolyte (solvent of CH₃CN) was injected into a space defined by the top substrate, the bottom substrate, and the spacers. Finally, the photo curable glue ITRI-MAS was applied to seal the injection hole, and then exposed to be cured. As such, a DSSC assembly was completed. After being exposed by a solar cell at room temperature for 160 hours, the DSSC assembly still had light conversion efficiency similar to a beginning light conversion efficiency (8%).

Example 5

The photo curable glue ITRI-MAS was coated on a top substrate and on the silver conductive wires onto the bottom substrate by screen printing. The top substrate and the bottom substrate were paired assembled and exposed under a UV light to cure the photo curable glue ITRI-MAS, thereby forming spacers. The spacer was then mechanically drilled to form an injection hole. A long-lifetime iodine-containing electrolyte (mixture of I₂, PMII (1-Propyl-3-Methylimidazolium), NMBI (N-methylbenzimidazole), and MPN (3-Methoxypropionitrile)) was injected into a space defined by the top substrate, the bottom substrate, and the spacers. Finally, the photo curable glue ITRI-MAS was applied to seal the injection hole, and then exposed to be cured. As such, a DSSC assembly was completed. After being exposed by a solar cell at room temperature for 1200 hours, the DSSC assembly still had light conversion efficiency similar to a beginning light conversion efficiency (5%).

Accordingly, the photo curable glue may serve as spacers of the DSSC to form an effective and stable sealant, and avoid the phenomenon where the electrolyte corrodes the silver conductive wires or leaks out after long time use.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A dye sensitized solar cell, comprising:
a substrate having a dye sensitized layer thereon;
an opposite substrate having a catalyst layer thereon;
a spacer disposed between the substrate and the opposite substrate to define a space; and
an electrolyte in the space,
wherein the spacer is formed by reacting a photo curable glue including 60wt % to 95wt % of a main oligomer, 0.5wt % to 10wt % of a photo initiator, 1wt % to 8wt % of a photo curing accelerator agent, 1wt % to 8wt % of a softener, 2wt % to 8wt % of an adhesion enhancer, and 1wt % to 8wt % of a chemical resistance additive,
wherein the main oligomer in the spacer is crosslinked,
wherein the main oliqomer, the photo initiator, the photo curing accelerator agent, the softener, the adhesion enhancer, and the chemical resistance are precursors that are reacted under exposure to UV radiation to form the spacer,
wherein the main oligomer is aliphatic polyurethane acrylate, wherein the photo initiator is 2-isopropyl-9H-thioxanthen-9-one, 2-Methyl-4'-(methylthio) -2-morpholinopropiophenone, or combinations thereof, wherein the photo curing accelerator agent is trimethylolpropane triacrylate, ethoxylated trimethylolpropane triacrylate, or combinations thereof, wherein the softener is 1,6-hexanediol diacrylate, neopentyl glycol diacrylate, tripropylene glycol diacrylate, or combinations thereof, wherein the adhesion enhancer is acrylic acid, 3-(trimethoxysilyl)propyl methacrylate, tetrahydrofurfuryl acrylate, or combinations thereof, and wherein the chemical resistance additive is acrylic acid isobornyl ester, 2-phenoxyethyl acrylate, 2-(2-ethoxyethoxy)ethyl acrylate, or combinations thereof.

2. The dye sensitized solar cell as claimed in claim 1, further comprising a conductive wire on the substrate and/or the opposite substrate, wherein the conductive wire is sealed by an additional photo curable glue to prevent the electrolyte from contacting the conductive wire, wherein the additional photo curable glue is of the same composition as the photo curable glue.

3. The dye sensitized solar cell as claimed in claim 1, further comprising a conductive wire on the substrate and/or the opposite substrate, wherein the conductive wire is sealed by the spacer to prevent the electrolyte from contacting the conductive wire.

\* \* \* \* \*